United States Patent [19]

Clarke

[11] Patent Number: 5,766,426
[45] Date of Patent: Jun. 16, 1998

[54] APPARATUS FOR, AND METHOD OF, DEPOSITING A FILM ON A SUBSTRATE

[75] Inventor: Andrew P. Clarke, Carpinteria, Calif.

[73] Assignee: Sputtered Films, Inc., Santa Barbara, Calif.

[21] Appl. No.: 388,475

[22] Filed: Feb. 14, 1995

[51] Int. Cl.⁶ ................................... C23C 14/34
[52] U.S. Cl. .................. 204/192.13; 204/298.03; 204/298.06; 204/298.08; 204/298.09; 204/298.11; 204/298.14
[58] Field of Search ................ 204/192.12, 192.13, 204/192.15, 192.3, 298.03, 298.06, 298.08, 298.09, 298.11, 298.14, 298.18

[56] References Cited

U.S. PATENT DOCUMENTS

| | | | |
|---|---|---|---|
| 4,100,055 | 7/1978 | Rainey | 204/298.18 X |
| 4,913,790 | 4/1990 | Narita et al. | 204/298.03 X |
| 4,994,162 | 2/1991 | Armstrong et al. | 204/192.3 X |
| 5,080,772 | 1/1992 | Hurwitt et al. | 204/298.03 X |
| 5,108,570 | 4/1992 | Wang | 204/192.3 |
| 5,126,028 | 6/1992 | Hurwitt et al. | 204/298.03 X |
| 5,135,634 | 8/1992 | Clarke | 204/298.11 X |

*Primary Examiner*—Nam Nguyen
*Attorney, Agent, or Firm*—Ellsworth R. Roston; Fulwider Patton Lee & Utecht, LLP

[57] ABSTRACT

An electrical field between a positive anode and a negative target in a cavity and a magnetic field in the cavity cause electrons from the target to ionize neutral gas (e.g. argon) atoms in the cavity. The ions cause the target to release sputtered atoms (e.g. aluminum) for deposition on a substrate. A shield between the target and the substrate inhibits charged particle movement to the substrate. The anode potential may be positive, and the shield and the magnetic members may be negative relative to the anode, to obtain electron movement to the anode, thereby inhibiting the heating of the shield and the magnetic members by electron impingement. The anode may be water cooled. The magnitude of the positive anode voltage relative to the target voltage provides selectively for (a) a uniform thickness of sputtered atoms on the walls of a groove in the substrate or (b) a filling of the groove by the sputtered atoms and a uniform thickness of deposition on the substrate surface including the filled groove. Progressive increases in the anode voltage produce progressive increases in the rate of the sputtered atom deposition on the substrate. A sensor may receive infra red energy passing from the substrate through a hole in the anode to provide signals having characteristics indicating variations in the substrate temperature. The anode voltage is varied in accordance with the characteristics of such signal to regulate the temperature of the substrate. The target voltage is preferably varied with the anode voltage variations to maintain the anode-cathode voltage difference substantially a constant.

35 Claims, 3 Drawing Sheets

APPARATUS FOR, AND METHOD OF, DEPOSITING A FILM ON A SUBSTRATE

This invention relates to a system for, and a method of, controlling the characteristics of the deposition on a substrate such as a wafer for integrated circuit chips or a magnetic transducer head. More particularly, this invention relates to a system for, and a method of, regulating the temperature of such a substrate so that a deposition with optimal characteristics can be provided on the substrate.

Wafers are fabricated with a plurality of dies (sometimes as many as hundreds) on each wafer. Each of the dies on a wafer subsequently forms an integrated circuit chip. The dies are tested while on the wafer to determine if they have been produced properly. The defective dies are marked to distinguish then from the satisfactory dies. The dies are then cut from the wafer and the satisfactory dies are retained for use as integrated circuit chips.

The wafers are produced from a plurality of successive layers, some of them formed electrically conductive material and others formed from electrically insulating material. When a layer of an electrically conductive material is formed, it generally is produced in a pattern to represent electrical circuitry. To produce this electrical circuitry, a layer of an electrically conductive material is initially deposited on the wafer, hopefully in a substantially uniform thickness. The layer is then masked with a material which is subjected to light in a pattern corresponding to the pattern of the electrical circuitry to be produced. The masking material subjected to the light is impervious to an etching material such as an acid.

The remaining portions of the layer are then etched as by an acid. The masking material subjected to the light is then removed from the remaining electrically conductive material in the layer. The electrically conductive material remaining in such layer is then joined with the electrically conductive material in other layers to define the electrical circuitry for each die on the wafer.

Apparatus has been in use for some time for depositing sputtered atoms on a wafer to produce a layer of material defined by the sputtered atoms. The apparatus now in use produces such a deposition by providing a glow discharge between an anode and a target in a cavity to obtain an emission of sputtered atoms from the target. A magnetic field co-operates with the electrical field providing the glow discharge to produce a force on the electrons for enhancing the movement of the electrons in the cavity between the target and the anode. This enhanced movement of the electrons facilitates the ionization of the neutral gas.

For example, when a layer of aluminum is to be deposited on a wafer, the target may be made from aluminum. When the target is bombarded with ions of an inert gas such as argon, the target emits sputtered atoms of aluminum. These sputtered atoms travel to the wafer and become deposited on the wafer to produce a substantially uniform layer of electrically conductive material on the wafer such as discussed in the previous paragraph.

In co-pending application Ser. No. 08/353,100 (attorneys file D-2694a) filed by Peter J. Clarke and Andrew P. Clarke on Dec. 7, 1994, for "Apparatus For, and Method of, Depositing a Film on a Substrate" and assigned of record to the assignee of record of this application, a system for, and a method of, providing a voltage difference of approximately five hundred volts (500 V.) between an anode and a target is disclosed. Providing such a high voltage difference is advantageous because it provides for a deposition of substantially uniform thickness on the substrate.

Depending upon the magnitude of the voltage on the anode, the deposition may be provided with a substantially uniform thickness on the surface of the substrate and on the walls of grooves in the substrate. For example, a deposition with such characteristics may be provided in grooves in the substrate when the voltage on the anode is approximately forty five volts (+45V.) and the target has a negative voltage of approximately four hundred and fifty five volts (−455V.). Alternatively, when the anode is at a positive potential of approximately two hundred volts (+200V.) and the target is at a negative potential of approximately three hundred volts (−300 V.), the deposition tends to fill the grooves and provide a substantially smooth surface with the remaining surface on the wafer.

Although the voltage difference of approximately five hundred volts (500 V.) between the anode and the target offers certain advantages as described in the previous paragraph, the glow discharge adjacent the anode has approximately the voltage of the anode. This causes the sputtered atoms emitted from the target to travel with a relatively high energy to the substrate and to impinge on the substrate with such a high energy. This high energy impingement causes the temperature of the substrate to rise. It has been found that it is not desirable for the temperature of the substrate to rise above a value such as approximately 450° C. Above that temperature, the substrate tends to deteriorate.

This invention provides a system for, and a method of, regulating the temperature of the substrate during the deposition of materials on the substrate so that the substrate temperature does not increase above approximately 450° C. The system and method of this invention provide such a regulation in a relatively simple and straight forward manner. In this way, the characteristics of the depositions on the substrate are maintained on an optimal basis.

In one embodiment of the invention, an electrical field between a positive anode and a negative target in a cavity and a magnetic field in the cavity cause electrons from the target to ionize neutral gas (e.g. argon) atoms in the cavity. The ions cause the target to release sputtered atoms (e.g. aluminum) for deposition on a substrate. A shield between the target and the substrate inhibits charged particle movement to the substrate.

The anode potential may be positive, and the shield and the magnetic members may be negative relative to the anode, to obtain electron movement to the anode, thereby inhibiting the heating of the shield and the magnetic members by electron impingement. The anode may be water cooled. The magnitude of the positive anode voltage relative to the target voltage provides selectively for (a) a uniform thickness of sputtered atoms on the walls of a groove in the substrate or (b) a filling of the groove by the sputtered atoms and a uniform thickness of deposition on the substrate surface including the filled groove.

Progressive increases in the anode voltage produce progressive increases in the rate of the sputtered atom deposition on the substrate. A sensor may receive infra red energy passing from the substrate through a hole in the anode to provide signals having characteristics indicating variations in the substrate temperature. The anode voltage is varied in accordance with the characteristics of such signal to regulate the temperature of the substrate. The target voltage is preferably varied with the anode voltage variations to maintain the anode-cathode voltage difference substantially a constant.

Figure 1:
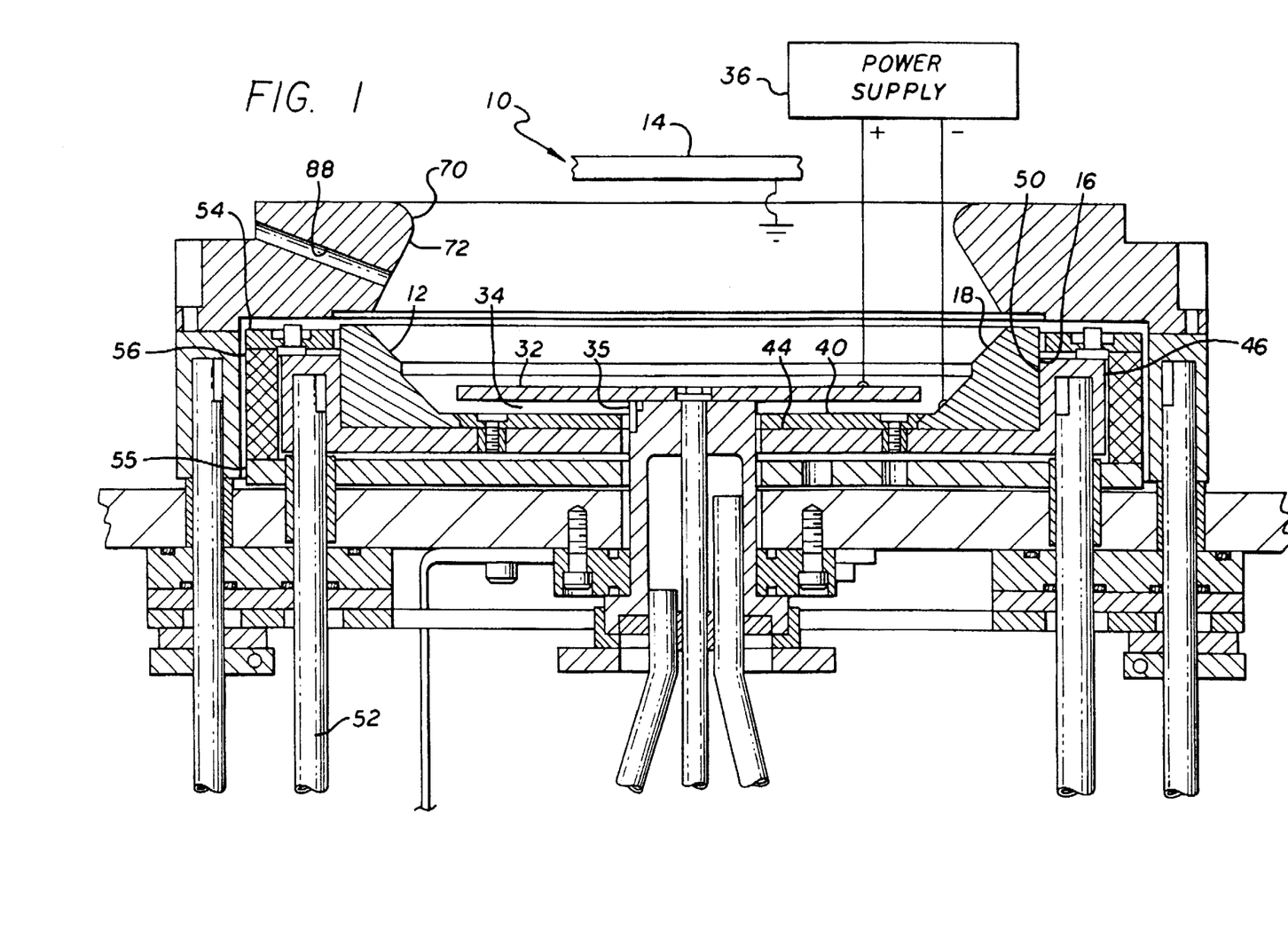
FIG. 1 is a fragmentary sectional view, in side elevation, of apparatus constituting one embodiment of the apparatus for depositing sputtered atoms of a material from a target on a surface of a substrate such as a wafer and on the walls of grooves in such surface.

In one embodiment of the invention, apparatus generally indicated at 10 in FIG. 1 is provided for depositing sputtered atoms from a target 12 onto a substrate 14. As one alternative, the substrate may constitute a wafer 14 which is used in the semiconductor industry. The wafer 14 may be disposed at a ground potential. The wafer 14 may be in the form of a thin disc made from a suitable material such as silicon dioxide and having a suitable diameter such as approximately five inches (5"). The wafer may hold a plurality of dies, each of generally identical construction and each forming, when completed, an integrated circuit chip defining complex electrical circuitry.

Each die 15 (FIG. 3) may be quite small (e.g. ¼"×¼") so that a considerable number of dies can be formed on a single wafer. Each die 15 may be provided with a surface 17 for receiving a uniform deposition of sputtered atoms and may be further provided with grooves 19 in such surface. The walls of the grooves 19 are also expected to receive a deposition of the sputtered atoms. In many instances, the deposition of the sputtered atoms on the walls of the grooves 19 is expected to be in a substantially uniform thickness.

Figures 2, 3:
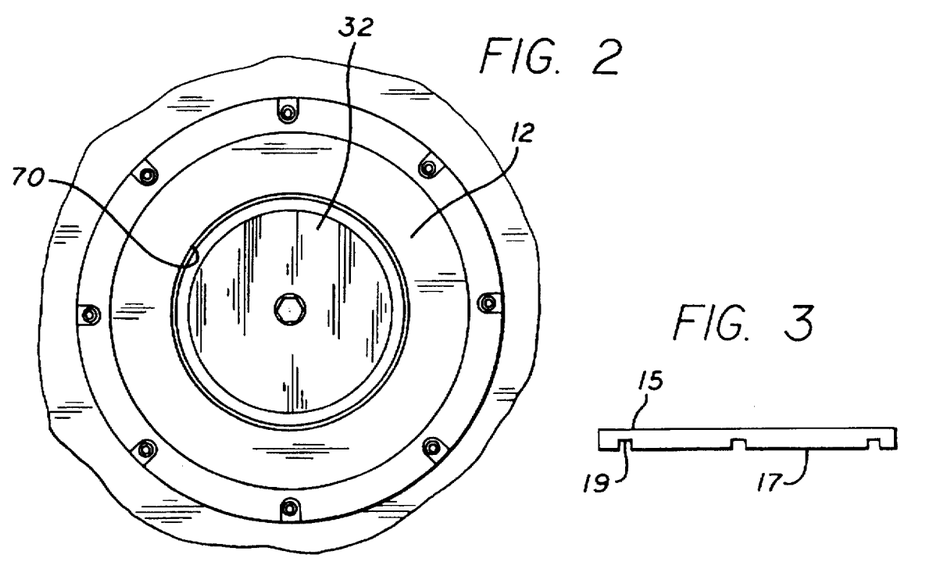
FIG. 2 is a top plan view of the embodiment shown in FIG. 1.
FIG. 3 is an enlarged elevational view schematically illustrating a substrate, and the grooves in a surface of the substrate, receiving the deposition of the sputtered atoms.

The target 12 may be a unitary member, preferably with an annular configuration, as shown in FIGS. 1 and 2. The target 12 may be defined by an annular external periphery 16 and may be provided with a centrally disposed opening defining a frusto-conical internal periphery 18. The internal periphery 18 of the target 12 may have a frusto-conical configuration. The target 12 may be made from a suitable material such as aluminum or titanium.

An anode 32 is disposed internally relative to the target 12 and may be supported in any suitable manner well known in the art. A chamber or cavity 34 is defined in part by the target 12. The cavity 34 holds atoms of an inert gas such as argon. The atoms of the inert gas such as argon are introduced to the cavity 34 through an inlet 35. An electrical field is provided between the anode 32 and the target 12 by connecting the anode and the targets respectively to the positive and negative terminals of a power supply 36. The anode 32 may be at ground potential or some suitable voltage above ground and the target 12 may be at a negative potential.

A clamp 40 is disposed in the central opening of the target 12 in abutting relationship with the internal periphery 18 of the target. The clamp 40 has a shoulder which overlays the internal periphery 18 of the target 12. The clamp 40 may be made from a suitable material such as copper. The clamp 40 is disposed against a support portion 44 of a cooling member 46 and is attached to the support portion of the cooling member as by screws.

The cooling member 46 has a portion 50 which abuts the external periphery 16 of the target 12. A passageway 52 is respectively disposed in the cooling member 46 and externally of the cooling member to provide for the flow of a fluid such as water to cool the clamp 40 and the target 12. A pair of magnetizable members 54 and 55 enclosing a permanent magnet 56 are disposed on opposite sides of the target 12 to create a magnetic field in the cavity 34. The magnetizable members 54 and 55 and the permanent magnet 56 may be at a ground potential.

The voltage difference between the anode 32 and the target 12 causes electrons from the discharge to travel toward the anode. The electrons move in a spiral path from the target 12 toward the anode 32 because the magnetic field produced in the cavity or chamber 34 by the permanent magnet 56 and the magnetizable members 54 and 55 has a force vector component in a direction perpendicular to the electrical field between the anode and the target. Because of this spiral path, the electrons have an ample opportunity to strike and ionize argon atoms in the cavity or chamber 34.

The argon ions travel to the frusto-conical internal periphery 18 of the target 12 and cause sputtered atoms to be released from this surface when they impinge on such surface. The sputtered atoms travel to the wafer 14 and become deposited on the wafer. As the gaseous material becomes depleted from the frusto-conical surface 20 of the target 12, the target becomes progressively worn. When the target 12 has become sufficiently worn, the target 12 is removed from the apparatus and is replaced by a new target.

As the sputtered atoms become released from the frusto-conical surface of the target 12, the target becomes heated. This would tend to cause the target to expand at its external periphery 16 in FIG. 1 because of metal expansion caused by heat. However, the external periphery 16 of the target 12 is maintained in fixed position by its mechanical abutment with the portion 50 of the cooling member 46 and by the cooling action of the cooling member. This cooling action results from the flow of a cooling fluid such as water through the passageway 52.

A shield 70 made from a suitable material such as aluminum is disposed between the target 12 and the wafer 14. The shield 70 is provided with a hollow interior 72 having a suitable configuration such as a frusto-conical configuration defining a funnel with progressive positions toward the wafer 14. The shield 70 may be provided with a suitable potential such as a ground potential.

Because of its ground potential, the shield 70 attracts electrons and negative ions in the space between the target 12 and the wafer 14. Since the charged particles produce heat when they impinge upon the wafer 14, the inhibition provided by the shield 70 against the movement of the charged particles to the wafer 14 causes the wafer to be maintained at a relatively cool temperature relative to the temperature of wafers in apparatus of the prior art. This allows the wafer 14 to be disposed closer to the target 12 than in the apparatus of the prior art.

By disposing the wafer 14 relatively close to the target 12, the sputtered atoms from the target can be deposited on the wafer 14 with a greater density than in the apparatus of the prior art. Furthermore, the sputtered atoms can be deposited on the wafer 14 with an enhanced uniformity of thickness relative to the deposition of the sputtered atoms on the wafer by the apparatus of the prior art.

The provision of a positive voltage on the anode 32 and of ground potentials on the magnetizable members 54 and 55, the permanent magnet 56, the shield 70 and the wafer 14 provides certain important advantages. It causes the anode 32, rather than the magnetizable members 54 and 55, the permanent magnet 56, the shield 70 and the wafer 14, to receive the electrons in the cavity. This inhibits the magnetizable members 54 and 55, the permanent magnet 56, the shield 70 and the wafer 14 from being excessively heated. This is significant because no cooling action is provided on the shield 70 or on the wafer 14.

Significant advantages are obtained by considerably increasing the difference in the voltage between the target 12 and the anode 32. For example, the voltage difference between the target 12 and the anode 32 may be as much as five hundred volts (500V.). In this relationship, the voltage on the anode 32 may be varied, with an inverse variation of the voltage on the target 12, to affect the characteristics of the deposition on the wafer 14.

Figure 4:
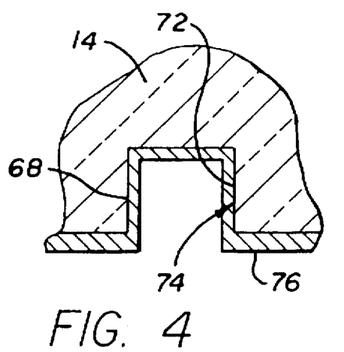
FIG. 4 illustrates on an enlarged fragmentary basis a groove in a substrate and a deposition of a substantially uniform thickness on the walls of the groove and, on the substrate by apparatus shown in FIGS. 1 and 2.

For example, when the positive potential on the anode 32 is approximately forty five volts (45V.) and the negative potential on the target 12 is approximately four hundred and fifty five volts (−455V.), a deposition 68 of a substantially constant thickness is made on the walls 72 of a groove 74 in the wafer 14 as illustrated schematically in FIG. 4. A deposition of a substantially uniform thickness is also provided on the smooth surface of the wafer 14 as illustrated schematically at 76 in FIG. 4. This is advantageous because it has been difficult, if not impossible, to provide a deposition of a uniform thickness on the walls of a groove such as the groove 74 on the adjacent surface 76 in the prior art by using a single target.

Figure 5:
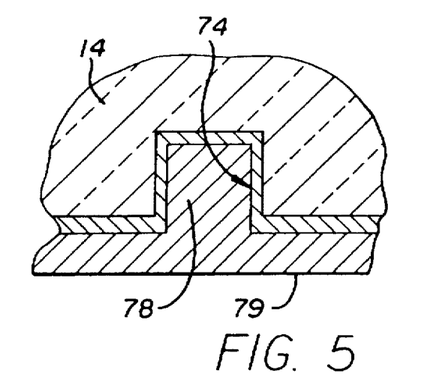
FIG. 5 illustrates on an enlarged fragmentary basis a groove in a substrate and a deposition to fill the substrate and to provide a substantially uniform thickness on the substrate and the area including the groove, this deposition being provided by apparatus shown in FIGS. 1 and 2.

Alternatively, when the anode 32 is at a high positive potential of approximately two hundred volts (+200V.) and the target is at a negative potential of approximately three hundred volts (−300V.), a deposition 78 tends to fill the groove 74 and to provide a substantially smooth surface 79 of the wafer 14 and in the area formerly occupied by the groove 74. This is indicated schematically in FIG. 5. It has been difficult, if not impossible, to accomplish this in the prior art.

The operations described above are not fully understood. However, it is known that a glow discharge of charged particles accumulates near the anode 32. This glow discharge may be produced in part from charged particles of argon when the argon is ionized by the electrons from the glow discharge. This glow discharge has a potential approaching that of the anode 32. For example, when the target 12 is at a negative potential of five hundred volts (−500V.) and the anode 32 is at substantially a ground potential, the glow discharge may be at a negative potential of approximately two volts (−2V.). Similarly, the glow discharge may be at a potential close to approximately one hundred volts when the anode 32 is at a positive potential of approximately one hundred volts (+100V.) and the target 12 is at a negative potential of four hundred volts (−400V.).

The ions formed in the glow discharge are attracted toward the wafer 14. The potential of the glow discharge is dependent upon the voltage on the anode. The potential difference between the glow discharge and the wafer 14 affects the characteristics of the deposition on the walls 72 of the groove 74 in the wafer 14 and on the smooth surface 76 of the wafer 14 as discussed in the previous paragraph.

Figure 6:
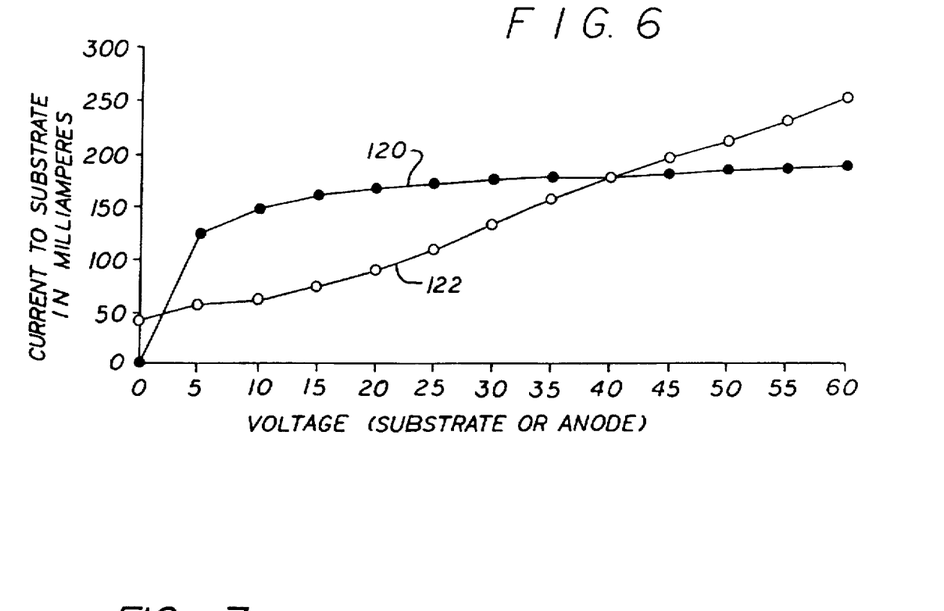
FIG. 6 shows curves illustrating (a) current to the substrate for progressive values of voltage on the substrate and (b) current to the substrate for progressive voltage differences between the anode and the substrate.

There are other advantages in a system providing a positive potential on the anode 32 relative to the voltage on a substrate such as the wafer 14. This may be seen from the curves schematically shown in FIG. 6. In FIG. 6, a curve 120 illustrates the relationship between changes in voltage on the substrate such as the wafer 14 relative to the current flowing to the wafer in milliamperes. This current indicates the rate of deposition of the sputtered atoms on the substrate 14. The curve 120 in FIG. 6 indicates that the current flow to the substrate 14 becomes substantially saturated when the negative voltage on the substrate 14 reaches a relatively low negative value such as approximately five volts (−5V.).

A curve 122 in FIG. 6 indicates the relationship between the voltage on the anode 32 (shown on the horizontal axis) and the current flowing to the substrate 14 in milliamperes (shown on the vertical axis). In the curve 122 shown in FIG. 6, the voltage on the horizontal axis is shown relative to a ground potential on the substrate 14.

As will be seen in FIG. 6, the current flowing to the substrate 14 continues to increase for anode voltages considerably in excess of five volts (5V.). Such measurements have been made to anode voltages of approximately sixty volts (+60V.). This relationship is further advantageous in that the current increase is substantially linear in the range to approximately sixty volts (+60V.) in the potential on the anode 32. The curve 122 shows a space charge limited current with no indication of saturation.

Since the potential of the glow discharge is close to the voltage of the anode 32 and since the rate of deposition of the sputtered atoms on the wafer 14 is dependent upon the potential of the glow discharge, the rate of deposition of the sputtered atoms on the wafer is relatively large when the anode has a potential which is relatively high. The temperature of the wafer 14 affects the characteristics of the wafer when the temperature exceeds a particular value such as approximately 450° C. Above this temperature, the wafer 14 tends to deteriorate.

Figure 7:
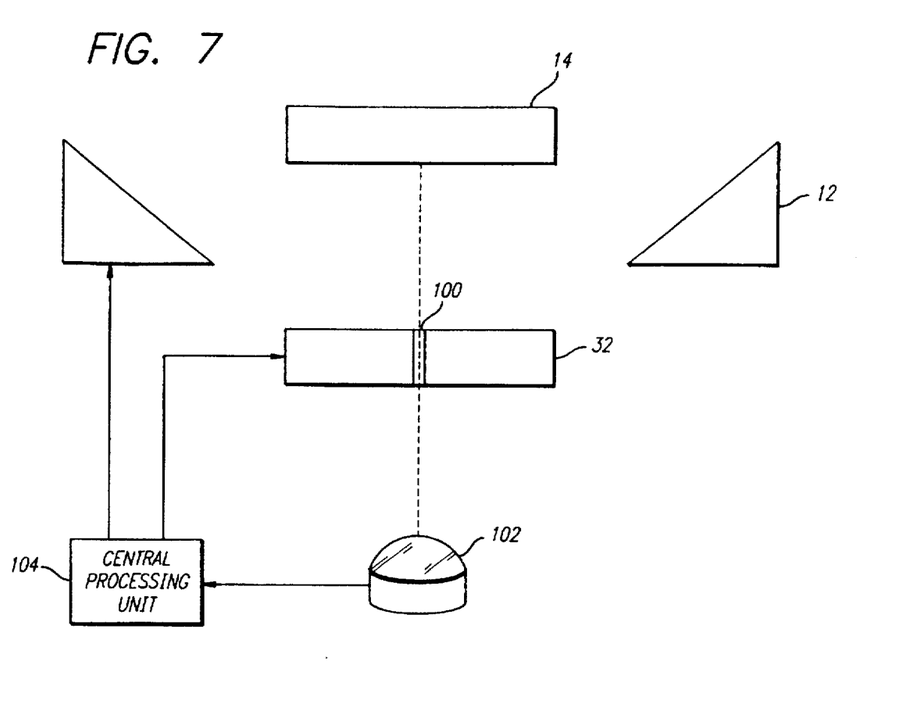
FIG. 7 is a schematic diagram of a system constituting one embodiment of the invention for regulating the temperature of the substrate so that the depositions on the substrate will have optimal characteristics.

This invention provides a system as shown schematically in FIG. 7 for regulating the temperature of the substrate so that the substrate temperature does not exceed 450° C. and preferably does not exceed a temperature which is uncomfortably close to 450° C. As shown in FIG. 7, the system includes the substrate or wafer 14 and the anode 32. A hole 100 is provided in the anode 32 to pass infra red energy from the substrate or wafer. As will be appreciated, the magnitude of the infra red energy passing through the hole 100 in the anode 32 is dependent upon the temperature of the substrate or wafer 14.

The infrared energy passing through the hole 100 is received by an infra red detector 102 which thus produces a signal with a magnitude dependent upon the temperature of the wafer 14. The signal on the detector 102 is introduced to a regulator 104 (shown as a central processing unit in FIG. 7) which varies the voltage on the anode 32 and the target 12 in accordance with variations in the magnitude of the signal from the detector 102. Thus, the voltage on the anode 32 is reduced when the temperature on the wafer 32 approaches approximately 450° C., thereby reducing the temperature of the substrate. In this way, the temperature of the wafer 32 is regulated so that it does not exceed a temperature of approximately 450° C.

Although this invention has been disclosed and illustrated with reference to particular embodiments, the principles involved are susceptible for use in numerous other embodiments which will be apparent to persons skilled in the art. The invention is, therefore, to be limited only as indicated by the scope of the appended claims.

I claim:

1. In combination for providing a controlled deposition on a substrate, an anode, a target spaced from the anode to serve as a cathode, the target having properties of emitting sputtered atoms when bombarded by gaseous ions and of directing the sputtered atoms to the substrate, first means for defining a cavity between the anode and the target for receiving atoms of an inert gas, second means for introducing the inert gas into the cavity, third means for applying a positive voltage to the anode and a negative voltage to the target relative to the positive voltage on the anode to establish a flow of electrons from the target toward the anode and a glow discharge between the target and the anode to ionize atoms of the inert gas in cavity, fourth means disposed relative to the anode and the target for providing a movement of the electrons between the target and the anode through other than a straight line path to enhance the ionization of the atoms of the inert gas and the emission of the sputtered atoms from the target for movement toward the substrate, fifth means for sensing the temperature of the substrate, and sixth means for varying the voltage on the anode relative to the voltage on the target to control the temperature of the substrate below a particular value.

2. In a combination as set forth in claim 1, the fifth means including a temperature sensor.

3. In a combination as set forth in claim 2, a hole in the anode for passing infrared energy from the substrate, the temperature sensing means being disposed on the opposite side of the anode from the substrate to sense the infrared energy from the substrate.

4. In a combination as set forth in claim 1, there being a particular difference in voltage between the anode and the target and the voltage on the anode being variable to obtain depositions of the sputtered atoms on the substrate with particular characteristics in accordance with such variations in the anode voltage.

5. In combination for providing a controlled deposition on a substrate, an anode, a hollow target spaced from the anode to serve as a cathode, there being a cavity between the anode and the hollow target to receive molecules of a neutral gas, a substrate disposed in the cavity to receive atoms of the material sputtered from the target, means for introducing the neutral gas into the cavity, means for applying a positive voltage to the anode and for applying to the target a voltage negative relative to the positive voltage on the anode to produce a flow of electrons from the target toward the anode for ionizing atoms of the neutral gas in the cavity and to establish a glow discharge near the anode, and means for producing a magnetic field between the anode and the target to provide for the movement of the electrons between the anode and the target in a convoluted path for ionizing molecules of the neutral gas in the cavity and to provide for an emission of sputtered atoms from the target for movement toward the substrate, the magnetic field means being at a negative voltage relative to the positive voltage on the anode, there being a particular difference in the voltages on the anode and the cathode, the positive voltage on the anode having a magnitude dependent upon the characteristics of the deposition of the sputtered atoms on the substrate, means for sensing changes in the temperature on the surface of the substrate, and means for varying the voltage on the anode relative to the voltage on the target in response to the sensed variations in the temperature on the surface of the substrate to maintain the temperature on the surface of the substrate below a particular value.

6. In a combination as set forth in claim 5, a shield disposed in the cavity between the target and the substrate and shaped to receive charged particles and prevent the charged particles from travelling to the substrate, the shield being at a voltage negative to the positive voltage on the anode, the substrate having at least one groove, the characteristics of the deposition on the substrate and in the groove of the substrate being dependent upon the magnitude of the positive voltage on the anode.

7. In a combination as set forth in claim 6, the substrate being at a voltage negative relative to the positive voltage on the anode, the groove being defined by walls in the substrate, the magnitude of the positive voltage on the anode being selected to selectively provide a deposition with a substantially uniform thickness on the surface of the substrate and on the walls of the groove or to substantially fill the groove and to provide the surface of the substrate and the filled groove with a deposition having a substantially smooth surface.

8. In a combination as set forth in claim 6, the sensing means being responsive to infrared energy, the voltage difference between the anode and the cathode being substantially constant, the anode having a small aperture and the sensing means being on the side of the anode from the substrate.

9. In a combination as set forth in claim 5, the sensing means being responsive to infrared energy, and the voltage difference between the anode and the cathode being substantially constant.

10. In a combination as set forth in claim 5, there being in the substrate a groove defined by walls, the glow discharge being at substantially the positive voltage of the anode and providing a deposition of the sputtered atoms from the target on the substrate to provide the deposition with a substantially uniform thickness on the walls of the groove or to substantially fill the groove and to provide the surface of the substrate and the filled groove with a deposition having a substantially smooth surface.

11. In combination for providing a deposition of sputtered atoms on a substrate, an anode, a target displaced from the anode to define with the anode a cavity for receiving atoms of a neutral gas in the cavity, means for introducing the neutral gas into the cavity, means for providing a positive voltage on the anode to produce a flow of electrons from the target toward the anode and to establish a glow discharge near the anode and to provide for an ionization by such electrons of atoms of the neutral gas in the cavity and an emission of sputtered atoms from the target to the substrate for a deposition of the sputtered atoms on the substrate, means for providing a negative voltage on the target relative to the positive voltage on the anode to attract the ions and obtain the emission from the target of sputtered atoms for movement toward the substrate, the voltages on the anode and the cathode creating an electrical field, means for creating a magnetic field in the cavity in a direction substantially perpendicular to the electrical field between the anode and the target to produce a force on the electrons for a movement of the electrons between the anode and the target through other than a straight line path and to enhance the ionization of the atoms of the neutral gas in the cavity, the magnetic field means being at a negative voltage relative to the positive voltage on the anode, there being a particular voltage difference between the anode and the cathode and the voltage on the anode having a magnitude controlling the characteristics of the deposition produced on the substrate, means for sensing variations in the temperature of the substrate, and means responsive to the sensed variations in the temperature of the substrate for varying the relative voltages on the anode and the target, while maintaining substantially the particular voltage difference between the anode and the target, to maintain the substrate temperature below a particular value.

12. In a combination as set forth in claim 11, a shield disposed in the cavity between the substrate and the target and connected at a negative voltage relative to the positive voltage on the anode and shaped to receive charged particles travelling toward the substrate, there being on the substrate a groove defined by walls, the voltage on the anode having a particular magnitude to provide the deposition on the substrate with a substantially uniform thickness on the substrate and on the walls of the groove.

13. In a combination as set forth in claim 12, means for cooling the anode, the particular magnitude of the positive voltage on the anode constituting a first particular magnitude to provide the deposition on the substrate with the substantially uniform thickness on the substrate and on the walls of the groove, the voltage on the anode having a second particular magnitude different from the first particular magnitude to provide the deposition with characteristics for the groove and providing a smooth surface on the substrate and the filled groove of the substrate.

14. In a combination as set forth in claim 11, the substrate being at a negative voltage relative to the anode, the particular voltage difference between the anode and the target being approximately five hundred volts (500V.).

15. In combination for providing a deposition of sputtered atoms on a substrate having in the substrate at least one groove defined by walls, an anode, a target displaced from the anode to define with the anode a cavity for receiving atoms of a neutral gas in the cavity, first means for introducing the atoms of the neutral gas into the cavity, second means for providing a positive voltage on the anode to produce a movement of electrons from the target toward the anode and to cause the ionization by such electrons of atoms of the neutral gas in the cavity, third means for providing a negative voltage on the target relative to the positive voltage on the anode to attract the ions and obtain the emission from the target of sputtered atoms for movement toward the substrate, the voltages on the anode and the target creating an electrical field for attracting the electrons toward the anode, fourth means for co-operating with the electrical field to increase the distance of travel of the electrons between the anode and the target and enhance the ionization of the atoms of the neutral gas in the cavity, the positive voltage on the anode and the negative voltage on the target relative to the positive voltage on the anode being chosen to control the thickness of the deposition and the characteristics of the deposition of the sputtered atoms on the substrate and on the walls in the groove in the substrate, fifth means for sensing variations in the temperature of the substrate, and sixth means responsive to the variations in the temperature sensed by the sensing means for varying the voltage on the anode to regulate the temperature of the substrate below a particular value.

16. In a combination as set forth in claim 15, the sixth means being responsive to the variations in temperature sensed by the fifth means for temperatures above a particular value for varying above the particular temperature value the voltage on the anode to regulate the temperature at the particular value.

17. In a combination as set forth in claim 16, the positive voltage on the anode and the negative voltage on the target relative to the positive voltage on the anode having relative values to produce a sputtered atom deposition of substantially uniform thickness on the walls of the groove in the substrate and on the substrate, the sensing means being responsive to infrared energy from the substrate to sense the variations in the temperature of the substrate, the sixth means being operative to vary the voltage on the anode while maintaining the voltage difference between the anode and the cathode substantially constant.

18. In a combination as set forth in claim 16, the positive voltage on the anode and the negative voltage on the target relative to the positive voltage on the anode having relative values to produce a deposition of sputtered atoms filling the groove and providing a substantially uniform thickness on the surface of the substrate and on the surface of the deposition in the filled groove, the sixth means being operation to vary the voltage on the anode while maintaining the voltage difference between the anode and the cathode substantially constant.

19. In a combination as set forth in claim 16, there being a hole in the anode, the fifth means being responsive to the energy passing through the hole from the substrate to sense the temperature of the substrate.

20. In a combination as set forth in claim 19, a shield disposed between the target and the substrate, the shield being shaped and provided with a voltage relative to the positive voltage on the anode to attract charged particles travelling toward the substrate, the positive voltage on the anode and the negative voltage on the target relative to the positive voltage on the anode having relative values to produce a sputtered atom deposition on the surface of the substrate and the walls of the groove with a substantially uniform thickness.

21. In a combination as set forth in claim 16, a shield disposed between the target and the substrate, the shield being shaped and provided with a voltage relative to the positive voltage on the anode to attract charged particles travelling toward the substrate, the positive voltage on the anode producing substantially linear increases in the magnitude of the flow of sputtered atoms to the substrate with progressive increases in the positive voltage on the anode.

22. In combination for providing a deposition of sputtered atoms on a substrate having at least one groove defined by walls, an anode, a target spaced from the anode to serve as a cathode, the target having properties of emitting sputtered atoms when bombarded by gaseous ions and of directing the sputtered atoms to the substrate, first means for defining a cavity between the anode and the target, second means for introducing an inert gas into the cavity, third means for applying a positive voltage of a first magnitude on the anode to establish a glow discharge between the target and the anode and to provide for the ionization by such glow discharge of atoms of the inert gas in the cavity, fourth means for providing a negative voltage of a second magnitude on the target relative to the positive voltage on the anode, fifth means disposed relative to the anode and the target for obtaining a movement of the ions toward the target in a path to obtain the emission of the sputtered atoms from the target for movement toward the substrate, the first magnitude of the positive voltage on the anode, and the difference between the voltages of the first and second magnitudes, producing a deposition of the sputtered atoms in the groove of the substrate with characteristics dependent upon the absolute value of the positive voltage on the anode and the difference between the voltages of the first and second magnitudes respectively on the anode and the target, means for sensing variations in the temperature of the substrate, and means for varying the first magnitude of the positive voltage on the anode, while substantially maintaining the difference between the first and second magnitudes, in response to the variations sensed by the sensing means in the substrate temperature to prevent the temperature of the substrate from exceeding a particular value.

23. In a combination as set forth in claim 22, the first magnitude of the positive voltage on the anode and the difference between the voltages of the first and second magnitudes respectively on the anode and the target providing for a deposition of sputtered atoms with a substantially uniform thickness on the walls of the groove.

24. In a combination as set forth in claim 22, the first magnitude of the positive voltage on the anode and the difference between the voltages of the first and second magnitudes respectively on the anode and the target providing for a sputtered atom deposition substantially filling the groove in the substrate and providing a smooth surface on the substrate and on the filled groove.

25. In a combination as set forth in claim 22, a shield disposed between the target and the substrate and shaped and provided with a negative voltage relative to the positive voltage on the anode to attract charged particles travelling toward the substrate, thereby inhibiting such charged particles from reaching the substrate, means for cooling the anode, the sensing means being operative to detect the variations in the infrared energy from the substrate, and the regulating means being responsive to the variations in the infrared energy detected by the sensing means for preventing the temperature of the substrate from exceeding the particular value.

26. In a method of providing sputtered atoms on a substrate and in the walls of a groove in the substrate, comprising the steps of:

providing an anode, providing a target in spaced relationship to the anode to define a cavity, providing a positive voltage on the anode and, on the target, a voltage negative relative to the first positive voltage on the anode to establish an electrical field between the anode and the target and to establish a glow discharge near the anode for the emission of electrons from the target and the movement of the electrons toward the anode, introducing atoms of a neutral gas into the cavity, providing a magnetic field in co-operation with the electrical field to facilitate the production of charged particles from the atoms of the neutral gas by the electrons and the movement of the charged particles toward the target for the sputtering of atoms from the target and the movement of the sputtered atoms toward the substrate, the anode and the target having a voltage difference to obtain a deposition of the sputtered atoms on the substrate and a deposition on the walls of the groove in the substrate with particular characteristics, and varying the voltage on the anode to prevent the temperature of the substrate from exceeding a particular value.

27. In a method as set forth in claim 26 wherein the positive voltage on the anode and the voltage on the target provide a deposition of the sputtered atoms with a substantially uniform thickness on the walls of the groove in the substrate.

13

28. In a method as set forth in claim 27 wherein a shield is disposed between the target and the substrate and is provided with a shape and a negative voltage relative to the positive voltage on the anode to attract charged particles travelling toward the substrate.

29. In a method as set forth in claim 26 wherein the positive voltage on the anode and the voltage on the target provide for a substantial filling of the filled groove of the substrate with the sputtered atoms and provide a substantially planar surface of the sputtered atoms on the substrate including on the area defined by the groove.

30. In a method as set forth in claim 26 wherein the voltage difference between the anode and the target is a particular value and wherein this voltage difference is substantially maintained when the voltage on the anode is varied to prevent the temperature of the substrate from exceeding the particular value.

31. In a method as set forth in claim 30 wherein the anode and the target are respectively provided with voltages with a particular difference in magnitude and the positive voltage on the anode provides an individual one of (a) a substantially uniform thickness of the deposition of the sputtered atoms on the walls of the groove and (b) a substantial filling of the groove in the deposition with the sputtered atoms and a substantially smooth surface of the deposition on the substrate and the filled groove and wherein the variations in the infrared energy from the substrate are sensed and wherein the voltage difference between the anode and the target is varied in accordance with the sensed variations in the infrared energy to prevent the temperature of the substrate from exceeding the particular value.

14

32. In a method as set forth in claim 31 wherein the anode is provided with a hole and the infrared energy passing from the substrate through the hole in the anode is sensed and wherein the voltage on the anode is varied in accordance with the infrared energy sensed after passing through the hole in the anode.

33. In a method as set forth in claim 32 wherein the anode is provided with a positive voltage of approximately forty five volts (45V.) and the target is provided with a negative voltage of approximately four hundred and fifty five volts (−455V.) to produce a deposition of the sputtered atoms with a substantially uniform thickness on the substrate and on the walls of the groove in the substrate.

34. In a method as set forth in claim 31 wherein the magnetic field is formed by a plurality of members and wherein the members forming the magnetic field are at a voltage negative relative to the positive voltage on the anode and wherein the anode is water cooled.

35. In a method as set forth in claim 30 wherein the anode is provided with a positive voltage of approximately two hundred volts (200V.) and the target is provided with a negative voltage of approximately three hundred volts (−300 V.) to substantially fill the groove with the deposition of the sputtered atoms and provide a substantially smooth surface of the sputtered atoms on the substrate including the area of the groove.

* * * * *